United States Patent
Friedrich et al.

(10) Patent No.: US 7,804,030 B2
(45) Date of Patent: Sep. 28, 2010

(54) PRINTED CIRCUIT BOARD

(75) Inventors: Ferdinand Friedrich, Heroldsberg (DE); Hubert Trageser, Igensdorf (DE); Bernhard Schuch, Neusitz (DE); Friedrich Nehmeier, Weisendorf (DE)

(73) Assignee: Conti Temic microelectronics Gmbh, Nuernberg (DE)

( * ) Notice: Subject to any disclaimer, the term of this patent is extended or adjusted under 35 U.S.C. 154(b) by 400 days.

(21) Appl. No.: 11/918,585

(22) PCT Filed: May 12, 2006

(86) PCT No.: PCT/DE2006/000825

§ 371 (c)(1),
(2), (4) Date: Oct. 15, 2007

(87) PCT Pub. No.: WO2006/119756

PCT Pub. Date: Nov. 16, 2006

(65) Prior Publication Data
US 2009/0056980 A1   Mar. 5, 2009

(30) Foreign Application Priority Data
May 12, 2005   (DE) .................. 10 2005 022 062

(51) Int. Cl.
*H05K 1/00*   (2006.01)
(52) U.S. Cl. .................. 174/252; 174/262; 174/266; 361/688; 361/690; 361/692; 361/696; 361/707
(58) Field of Classification Search ......... 174/260–266, 174/250, 252, 15.2, 16.3, 255; 361/760, 361/748, 688, 687, 690, 676, 701–712, 692, 361/693; 257/706, 707, 712, 713; 165/185, 165/104.33, 80.5
See application file for complete search history.

(56) References Cited

U.S. PATENT DOCUMENTS 4,396,936 A   8/1983   McIver et al.

(Continued)

FOREIGN PATENT DOCUMENTS

DE   42 32 575   3/1994

(Continued)

OTHER PUBLICATIONS

Steinberg, D.S.; Cooling Techniques for Electronic Equipment, 2nd Ed. John Wiley & Sons, Inc., USA.ISBN 0-471-52451-4, pp. 77-81; Fig. 4.1.a, 1980.

*Primary Examiner*—Dameon E Levi
*Assistant Examiner*—Hoa C Nguyen
(74) *Attorney, Agent, or Firm*—W. F. Fasse; W. G. Fasse

(57) ABSTRACT

A circuit board (1) has a top face (2) for positioning an electronic component and a bottom face (4) used as a support on a heat-dissipating base. A plurality of heat transfer holes (12) provide heat transfer from the top face (2) to the bottom face (4). The heat transfer holes (12) are unevenly or non-uniformly distributed on the top face (2) in such a way that the top face (2) is provided with several free sectors (14) which are free of heat transfer holes (12) in order to connect the electronic component to the circuit board (1). The free sectors (14) are configured as columns or lines. A plurality of heat transfer holes (12) are placed at least along the long sides of the free sectors (14). The circuit board has a low thermal resistance between the electronic component and the heat-dissipating base.

29 Claims, 11 Drawing Sheets

U.S. PATENT DOCUMENTS

| | | | |
|---|---|---|---|
| 5,375,039 A | 12/1994 | Wiesa | |
| 5,842,275 A | 12/1998 | McMillan, II et al. | |
| 6,190,941 B1 | 2/2001 | Heinz et al. | |
| 6,441,312 B1 * | 8/2002 | Tanimura et al. | 174/252 |
| 2003/0184970 A1 | 10/2003 | Bosch et al. | |
| 2003/0234441 A1 * | 12/2003 | Delheimer | 257/678 |
| 2004/0037044 A1 * | 2/2004 | Cook et al. | 361/719 |
| 2004/0119157 A1 | 6/2004 | Barcley | |
| 2004/0212074 A1 * | 10/2004 | Divakar et al. | 257/698 |

FOREIGN PATENT DOCUMENTS

| | | |
|---|---|---|
| DE | 43 35 946 | 4/1995 |
| DE | 195 06 664 | 2/1996 |
| DE | 196 40 435 | 4/1997 |
| DE | 197 23 409 | 12/1998 |
| DE | 198 18 502 | 10/1999 |
| DE | 198 42 590 | 4/2000 |
| DE | 103 35 805 | 3/2005 |
| EP | 0 869 704 | 10/1998 |
| GB | 2 325 082 | 11/1998 |

* cited by examiner

PRINTED CIRCUIT BOARD

FIELD OF THE INVENTION

The invention relates to a printed circuit board with heat transfer holes or thermal vias extending through it.

BACKGROUND INFORMATION

A printed circuit board of this type is known from obvious prior use. Such printed circuit boards are used for SMD assembly with electronic components. These electronic components can be those, which in operation produce a substantial waste heat. In order to prevent destruction of the electronic components this waste heat must be efficiently dissipated. With this heat dissipation the printed circuit board as a rule is the component with the highest thermal resistance or heat (transfer) resistance, respectively. The thermal resistance of the prior known printed circuit board is still too high for sophisticated assembly tasks.

SUMMARY OF THE INVENTION

It is therefore an object of the present invention to further develop a printed circuit board of the initially mentioned type such that the thermal resistance of the printed circuit board between the electronic component and the heat dissipating base is reduced.

This object is achieved in accordance with the invention by a printed circuit board having the features disclosed and claimed herein. An inventive printed circuit board has
 a top face for positioning an electronic component,
 a bottom face to support on a heat-dissipating base,
 a plurality of heat transfer holes, which create a heat transfer from the top face to the bottom face,
 wherein the heat transfer holes are non-uniformly distributed on the top face in such way that the top face has several free sectors, which are free from heat transfer holes in order to connect the electronic component to the printed circuit board,
 characterized in that the free sectors are each configured as a respective elongated free area having an elongated strip shape with two opposite longer sides extending parallel to an elongation direction and two opposite shorter sides extending transversely to the elongation direction, wherein the longer sides are longer than the shorter sides, and wherein a respective plurality of the heat transfer holes are positioned adjacent to each one of the longer sides and are spaced apart from one another in a respective row extending parallel to the elongation direction along each one of the longer sides of the elongated free areas, and wherein an in-row spacing distance between adjacent ones of the heat transfer holes in one of the rows is less than a transverse spacing distance between two of the rows that are respectively adjacent to the two opposite longer sides of one of the elongated free areas.

At the free sectors the electronic component is connected to the printed circuit board. As these free sectors are free of heat transfer holes for the purpose of enlargement of the connecting surface, at this place there is a more complicated heat transfer. It was recognized according to invention that the concept of the sectors being free of heat transfer holes can be maintained, if the free sectors are at least lengthwise surrounded by heat transfer holes. These heat transfer holes reduce the thermal resistance of the printed circuit board. By the arrangement according to invention it is ensured that in direct vicinity of the free sectors a sufficient number of heat transfer holes is available, which enable a heat passage, so that the thermal resistance of the printed circuit board as a whole is sufficiently low and thus uncritical also in the region of the free sectors. Heat transfer holes are assigned to each long side of the free sectors.

For a sufficient connection of the electronic component to the printed circuit board a certain minimum connecting surface must be provided on the top face of the printed circuit board. As was recognized in a preferred embodiment with at least three or preferably four free sectors, this minimum connecting surface can be distributed to a plurality of free sectors. The smaller the surface of the individual free sectors, the smaller the risk that a dangerous heat accumulation arises here.

A preferred arrangement in which at least two but preferably all of the free sectors are surrounded all around by heat transfer holes increases the heat dissipation within the region adjacent to free sectors.

A packing density of fifty heat transfer holes per 100 mm$^2$ of surface of the circuit board results in a thermal resistance of the printed circuit board being sufficiently low also for sophisticated assembly tasks.

The heat transfer holes are most efficient to the heat transfer at that place, where they are covered by the electronic component. Therefore, the heat transfer holes are preferably located exclusively where they will be covered at least partially by the mounted electronic component, which results in an advantageously low thermal resistance.

A preferred feature, whereby the shape of the area of the circuit board provided with heat transfer holes is matched to the shape of the mounting surface of the electronic component, leads to an efficient, in particular compact heat transfer arrangement.

Grid dimensions of the heat transfer holes spaced apart at most 1.5 mm, preferably at most 1.25 mm, and especially preferably 1.0 mm proved to be particularly advantageous for the creation of a low thermal resistance.

A simple cubic packing of the heat transfer holes permits the accommodation of a high number of heat transfer holes with given grid dimension and given surface. Compared to less close packings this can again reduce the thermal resistance.

A solder layer may be provided on the circuit board, preferably only in the free sector areas, which prevents solder from penetrating into the heat transfer holes during soldering of the electronic component. The advantageous low thermal resistance of the heat transfer holes is then maintained. A limitation of the surface expansion of the solder layer in such a manner that it is available only within the free sectors, is preferably effected by use of a layer of solder masking paint surrounding the solder layer and if necessary individual sectors thereof. By the limitation of the solder layer to the free sectors a defined soldering result is obtained. Short-circuits on the bottom face of the printed circuit board, e.g. towards a cooling body, are avoided. As far as solder masking paint is used, preferably the free sectors are free of soldering masking paint, so that solder can be applied there.

Solder layer dimensions preferably of 1 mm×10 mm within a free sector area represent a good compromise between sufficient size of the connecting surface for safe connection of the electronic component to the printed circuit board on the one hand and lowest possible surface for reduction of the thermal resistance on the other hand. Besides, the limitation of size of the free sectors leads to the fact that during soldering cavities in the solder layer are avoided.

Heat transfer holes preferably having a width of 0.3 mm to 0.5 mm can be packed particularly closely.

Heat transfer holes having a heat-conducting coating, preferably of metal about 30 mm thick, comprise an advantageously low thermal resistance.

Heat transfer holes that are preferably free, i.e. unfilled, can be manufactured at low costs.

BRIEF DESCRIPTION OF THE DRAWINGS

Examples of embodiment of the invention are described in detail in the following taken in conjunction with the drawings, which show FIG. 1 schematically and perspectively an electronic component, which is installed above a printed circuit board at a cooling body.

DETAILED DESCRIPTION OF EXAMPLE EMBODIMENTS

Figure 1:
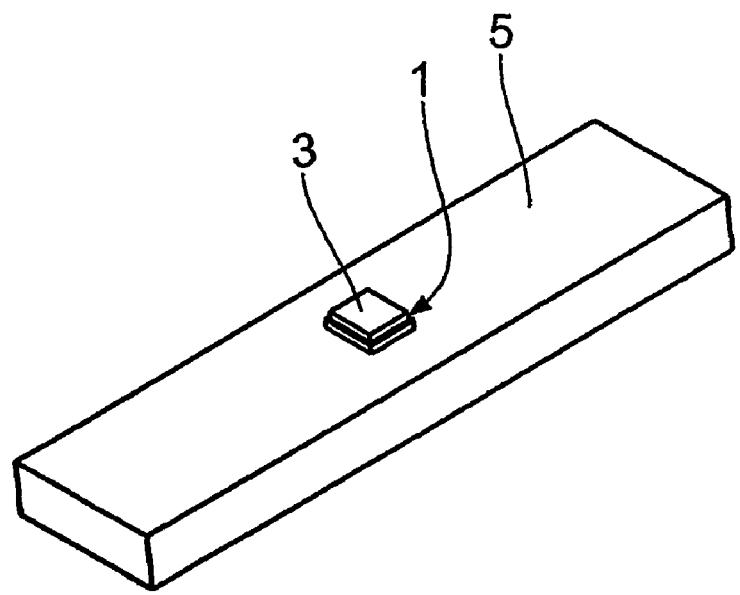

FIG. 1 shows schematically an exemplary structure, in which a printed circuit board 1, a so-called pad, is used. This schematic structure usually does not have anything in common with the actual field of application of the printed circuit board 1 and is used for determining the thermal resistance $R_{th}$ through the printed circuit board 1. In fact, the printed circuit board 1 in the form as represented in the drawing and described hereinafter is merely a cutout of a real printed circuit board with a plurality of electronic components and associated conductor paths. Therefore, if in this description a printed circuit board 1 is addressed, a cutout of a real printed circuit board is actually meant. An electronic component 3 lies on a top face 2 of the printed circuit board 1. This is e.g. a field-effect transistor FET for use in particular in the automotive field, e.g. with ignition systems. Due to the support on the printed circuit board 1 the electronic component 3 is installed in SMD (Surface-Mounted-Device) style. A bottom face 4 of the printed circuit board 1 rests upon a heat dissipating base, a copper block 5. Instead of a copper block 5 also an aluminum block can be used. Generally, aluminum can be used instead of copper in case of a variant of the shown embodiments.

Figure 5:
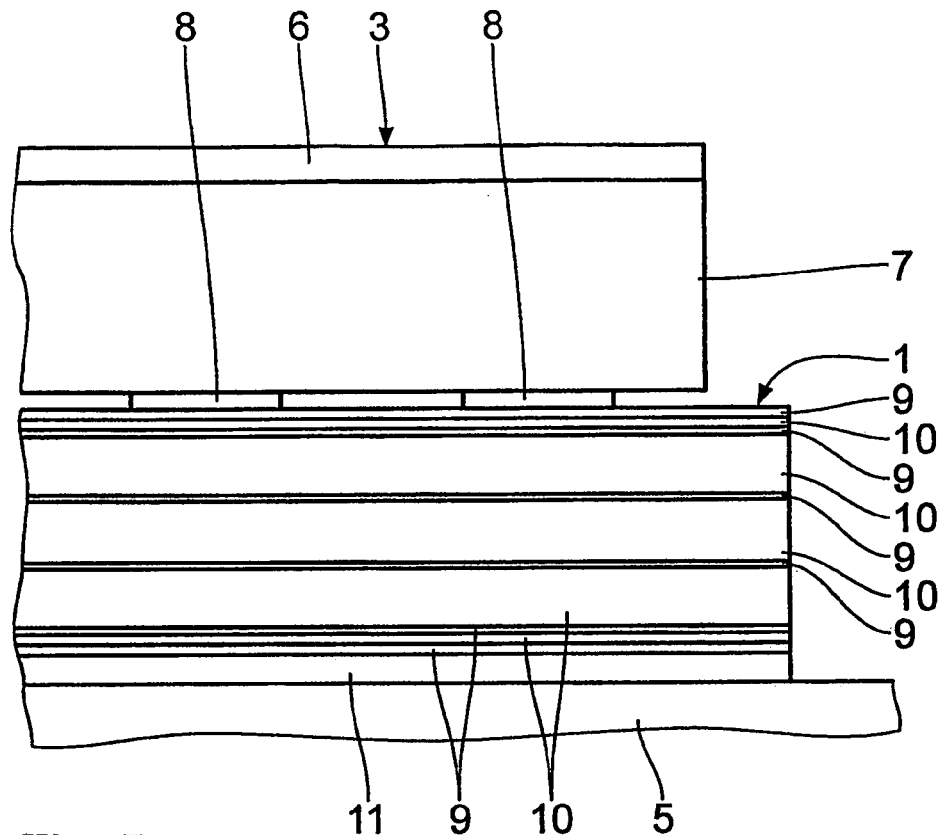
FIG. 5 a vertical section through the structure according to FIG. 1 drawn to a larger scale and shown in broken lines.

The vertical cut according to FIG. 5 through the structure according to FIG. 1 makes clear the different layers, of which the printed circuit board 1 and the electronic component 3 are composed, and, moreover, shows the connecting layers between the components of the structure according to FIG. 1. The highest layer shown in FIG. 5 is a silicon layer 6, which represents the actual electronic component. This silicon layer 6 is connected to an underlying copper layer 7, the so-called spreader, for the purpose of heat dissipation. The copper layer 7 is connected via a solder layer 8 in sectors to the printed circuit board 1. Between the individual sectors of the solder layer 8 a solder masking paint can be applied onto the printed circuit board 1. The solder masking paint guarantees a defined expansion of the individual sectors of the solder layer 8, wherein ideally each individual sector of the solder layer 8 is completely surrounded by solder masking paint, which represents in this way a limitation of the solder layer 8 in all directions parallel to the level of the printed circuit board 1. The printed circuit board 1 in turn represents a layer structure from a plurality of copper layers 9 and prepreg layers 10. Two of the copper layers 9 limit the printed circuit board 1 on top and bottom, so that both along the top face and along the bottom face a good superficial thermal conduction is available over the entire surface of the printed circuit board 1. Via a further solder layer 11 the printed circuit board 1 is soldered onto the copper block 5. Instead of the bottom solder layer 11 shown in FIG. 5 also a thermal conductive adhesive can be used. Such a thermal conductive adhesive can fulfill in additional the function of an electrical insulator.

The printed circuit board 1 comprises a plurality of heat transfer holes 12, which create a heat transfer from the top face 2 to the bottom face 4, i.e. with an installed printed circuit board 1 between the electronic component 3 and the copper block 5. In the embodiment according to FIG. 2 the heat transfer holes 12 are free, thus unfilled. Each heat transfer hole 12 carries in the interior a heat conducting coating not shown in detail. This is a copper coating with a layer thickness from 30 to 35 µm. The heat transfer holes 12 are embodied as through-holes running perpendicular to a main level 13 (comp. FIG. 5) of the printed circuit board 1. In the embodiment according to FIG. 2 the heat transfer holes 12 have a width of 0.3 mm.

Figure 4:
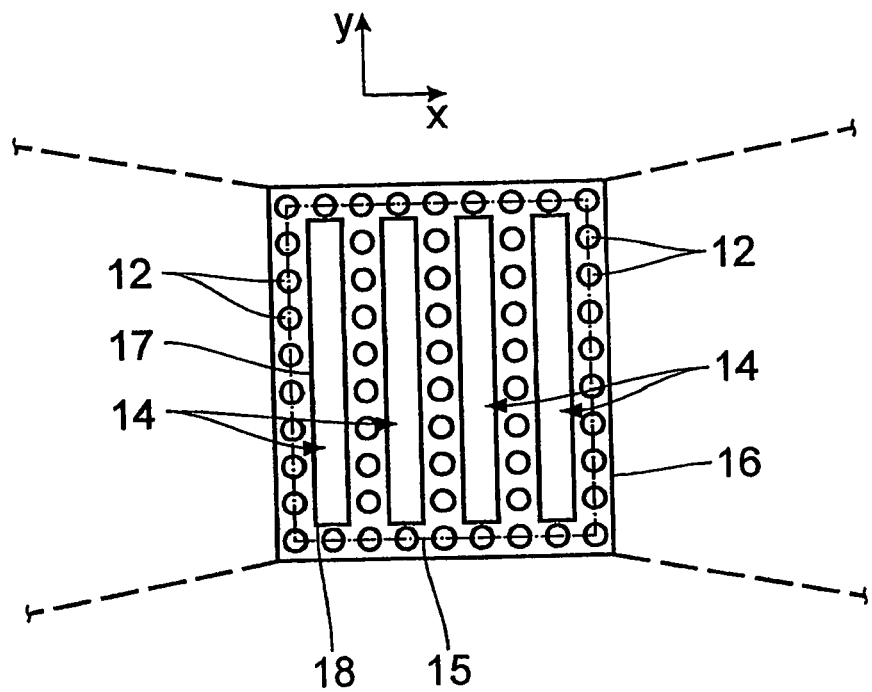
FIG. 4 approximately in the scale of FIG. 2 a top view onto the printed circuit board, which makes clear the arrangement of heat transfer holes in the printed circuit board.

The printed circuit board 1 is rectangular with external dimensions of 9 mm (in x-direction, i.e. in the extension direction being horizontal in FIG. 4) times 10 mm (in y-direction, i.e. in the extension direction being vertical in FIG. 4).

Figure 2:
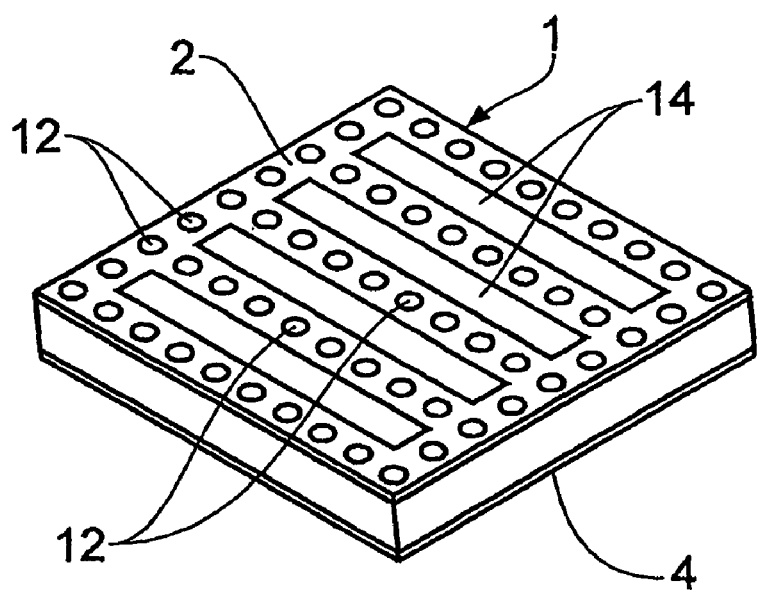
FIG. 2 drawn to a larger scale perspectively the printed circuit board during assembly according to FIG. 1.
Figure 3:
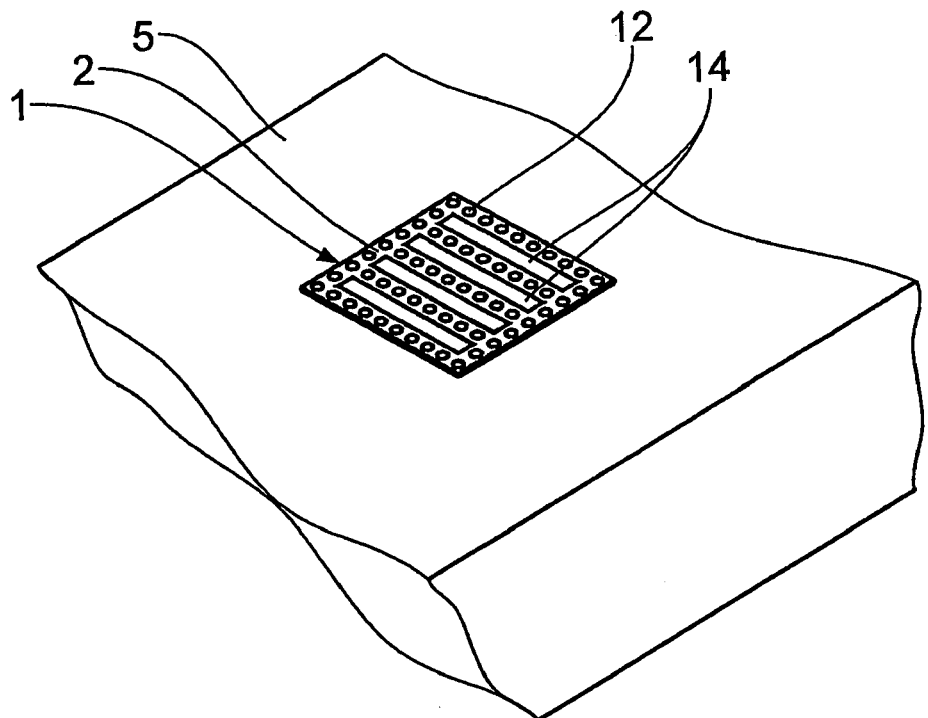
FIG. 3 in contrast to FIG. 2 drawn to a smaller scale and in contrast to FIG. 1 drawn to a larger scale the printed circuit board applied on the cooling body.

In total, in the embodiment according to FIG. 2 there is a number of 58 heat transfer holes 12. These are irregularly i.e. non-uniformly distributed on the top face 2 of the printed circuit board 1 in such a manner that the top face 2 comprises several free sectors 14, in the embodiment according to FIG. 2 altogether four free sectors 14. These free sectors 14 are free from heat transfer holes 12 in order to connect the electronic component 3 to the printed circuit board 1, so that in the region of the free sectors 14 there are no heat transfer holes 12. Due to the solder masking paint the solder layer 8 can be applied only in the region of the free sectors 14 on the top face 2 for connection to the electronic component 3. In the embodiment according to FIG. 4 the free sectors 14 are arranged as four columns parallel to the longer side of the rectangular printed circuit board 1 (y-direction). The free sectors 14 lie within a rectangular connecting region 15, while in case of an installed electronic component 3 this rests against the top face 2 of the printed circuit board 1. The four free sectors 14 are rectangular with dimensions of 0.9 mm in x-direction and 8 mm in y-direction. The heat transfer holes 12 are arranged on the printed circuit board 1 in such a manner that with the applied electronic component 3 they are covered at least partially or geometrically, respectively, by it.

The side dimensions of the printed circuit board 1 or of the pads, respectively, are such that a surface region 16 of the top face 2 of the printed circuit board 1, which is provided with heat transfer holes 12, is adapted geometrically to geometry of the connecting region 15 of the electronic component 3, which rests against the top face 2 of the printed circuit board 1.

The rectangular connecting region 15 has the dimensions 8 mm×9 mm, the adaptation of the surface region 16 provided with heat transfer holes 12 to the dimensions of the connecting region 15 being such that the surface region 16 projects beyond all four sides of the connecting region 15 by 0.5 mm each.

In the embodiment according to FIG. 2 apart from the free sectors 14 the heat transfer holes 12 are arranged in a regular grid without offset with a grid width of 1.0 mm.

Adjacent to each one of the long sides 17 running in y-direction of the free sectors 14, respectively eight heat transfer holes 12 are arranged. Adjacent to each one of the small sides 18 running in x-direction of the free sectors 14, again respectively one heat transfer hole 12 is arranged. Besides, adjacent to each corner of the free sectors 14 another heat transfer hole 12 is arranged, so that each of the four free sectors 14 is surrounded all around by a total of twenty-two heat transfer holes 12.

FIGS. 6 to 20 show further arrangement variants of heat transfer holes 12 on printed circuit boards. The printed circuit boards as well as the arrangements of the heat transfer holes 12 in the variants according to FIG. 6 to 20 are only described, where they differ from that, what was discussed already for the embodiment according to FIGS. 1 to 5.

Figure 6:
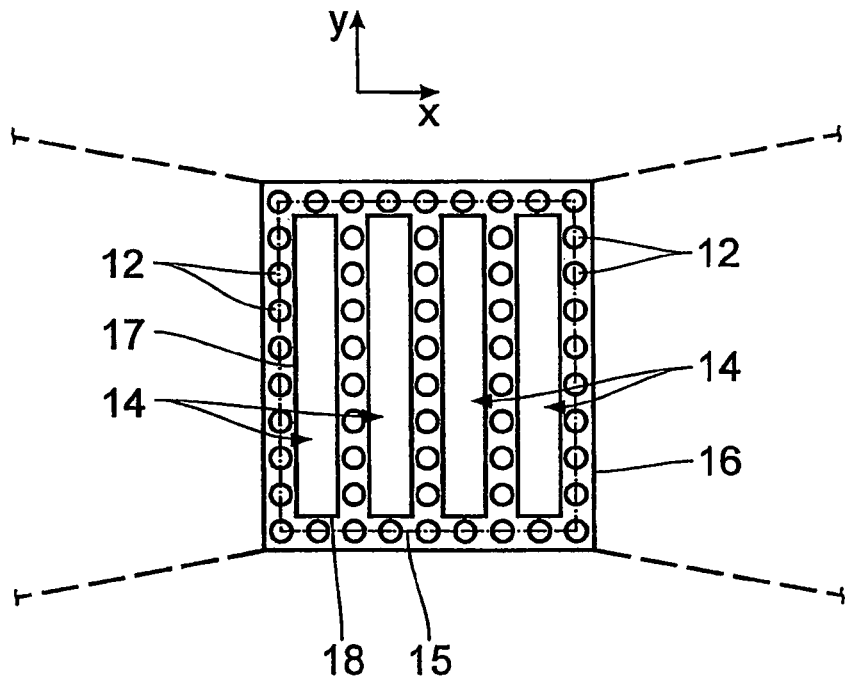
FIG. 6 a top view of a further form of embodiment of a printed circuit board similar to FIG. 4.

The embodiment according to FIG. 6 comprises rectangular free sectors 14 with an extension of 1.2 mm in x-direction and 8.2 mm in y-direction. By the enlarged free sectors 14 and the enlarged solder surfaces resulting therefrom an improvement of the adhesion of the electronic component 3 at the top face 2 of the printed circuit board 1 is effected.

Figure 7:
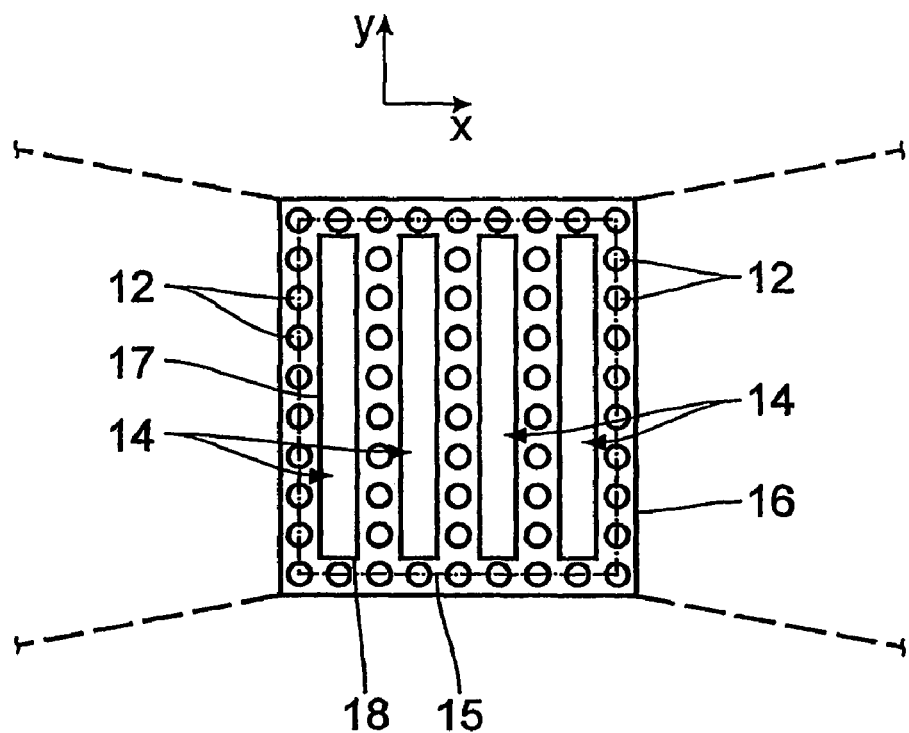
FIG. 7 to 20 top views of further forms of embodiment of a printed circuit board similar to FIG. 4.

In the embodiment according to FIG. 7 the free sectors 14 have dimensions of 0.9 mm in x-direction and 8.2 mm in y-direction. Also through this compared to the free sectors 14 according to FIG. 4 an improvement of the adhesion of the electronic component 3 at the printed circuit board 1 is made possible. Compared to the variant according to FIG. 6 the long sides 17 are distanced slightly further from the heat transfer holes 12 adjacent to them, so that the risk of an unwanted entrance of solder into the heat transfer holes 12 is reduced.

Figure 8:
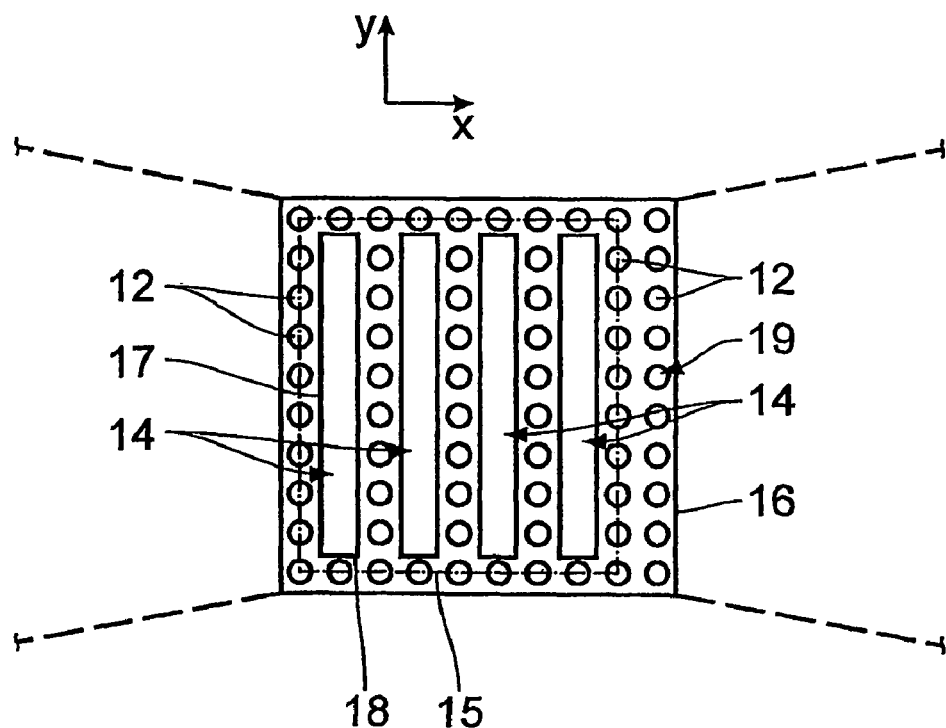

In the embodiment according to FIG. 8 the surface region 16 of the printed circuit board 1 is widened in x-direction by 1 mm, so that a square printed circuit board 1 with dimensions 10 mm×10 mm is effected. Otherwise the embodiment is unchanged regarding the relative arrangement of the printed circuit board 1 to the electronic component 3. In FIG. 8 on the right a further column 19 with a total of ten heat transfer holes 12 results, which is not covered by the electronic component 3. Thus, the number of heat transfer holes in the embodiment according to FIG. 8 is increased to a total of 68. By means of the ten additional heat transfer holes 12 the heat transfer through the printed circuit board 1 is improved.

Figure 9:
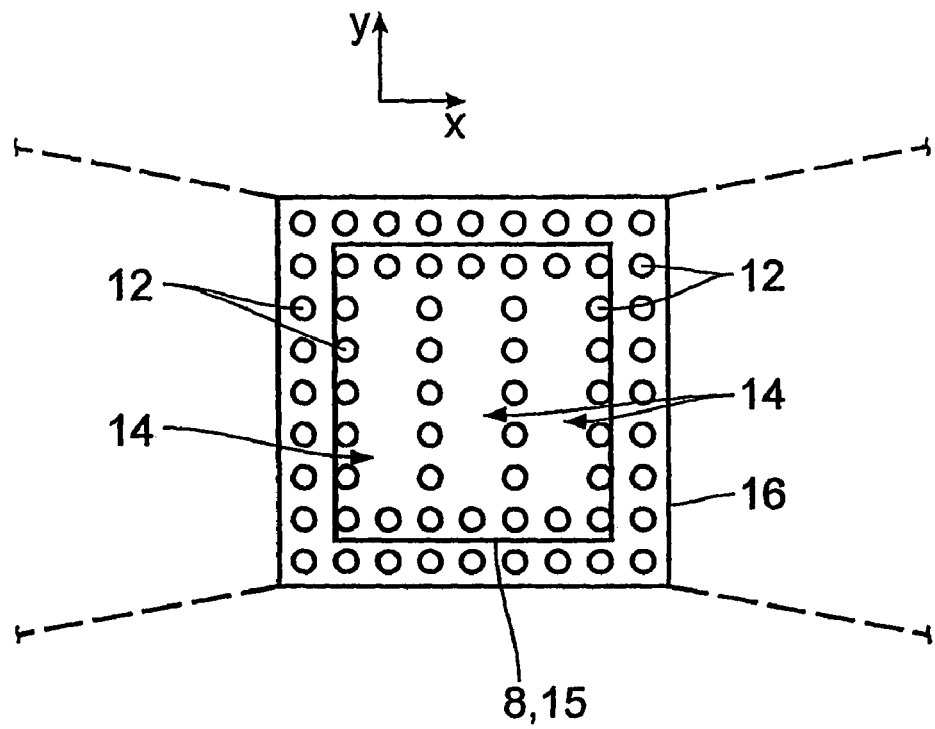

In the embodiment according to FIG. 9 the dimensions of the solder layer 8 coincides with those of the connecting region 15. Consequently, at this place solder is present also outside of the free sectors 14. In the embodiment according to FIG. 9 altogether three free sectors 14 are provided. Apart from the free sectors 14 in the embodiment according to FIG. 9 the heat transfer holes 12 are provided in a regular, offset-free, i.e. cubic-face-centered grid with a grid width of 1.25 mm. In this form of embodiment five heat transfer holes 12 each are adjacent to the long sides of the free sectors 14. In this form of embodiment one heat transfer hole 12 each is adjacent to the small sides of the free sectors 14. Also to the four corners of the free sectors 14 one heat transfer hole 12 each is adjacent in this embodiment, so that all three free sectors 14 in this embodiment are surrounded by a total of sixteen transfer holes 12. Towards the outside a squarely rotating external path with nine heat transfer holes each per side is attached to the heat transfer holes 12 adjacent to the free sectors of this embodiment. Therefore, in the embodiment according to FIG. 9 there is a total of 66 transfer holes 12. The surface region 16, which is provided with heat transfer holes 12, has dimensions of 11.5 mm×11.5 mm in case of the printed circuit board 1. With an electronic component 3 with connecting region dimensions of 8 mm×9 mm a projection of the surface region 16 beyond the connecting region 15 in x-direction of 1.75 mm and in y-direction of 1, 25 mm results. The path rotating outside of heat transfer holes 12 is not covered by the electronic component 3. All other heat transfer holes 12 are covered by the electronic component 3. The enlargement of the accessible solder surface leads to an improvement of the adhesion of the electronic component 3 at the top face 2 of the printed circuit board 1. The external path of heat transfer holes 12 at least partially compensates the decrease of the heat transfer by the increase of the grid dimension of the heat transfer holes 12 compared to the embodiments according to FIGS. 1 to 8.

Figure 10:
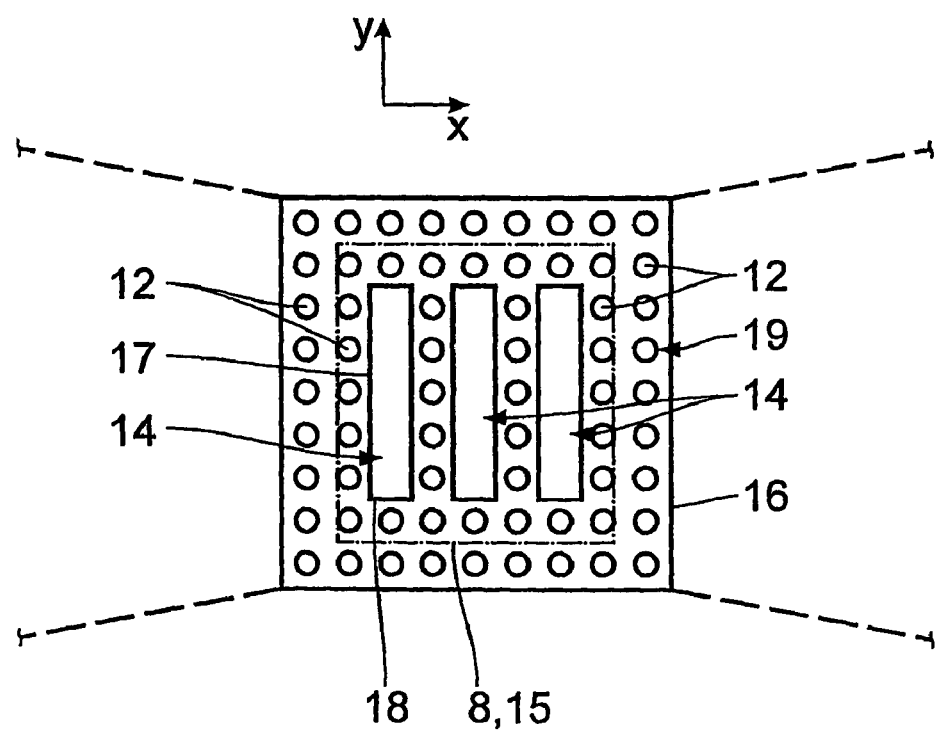

The embodiment according to FIG. 10 corresponds to that according to FIG. 9 with the difference that in the embodiment according to FIG. 10 the solder layer 8 for connecting the electronic component 3 to the printed circuit board 1 is freely accessible only within the free sectors 14 on the top face 2.

In the embodiment according to FIG. 10 there are 66 heat transfer holes 12. The reduction of the freely accessible solder layer 8 to the free sections 14 prevents that solder penetrates into the heat transfer holes 12 during soldering.

Figure 11:
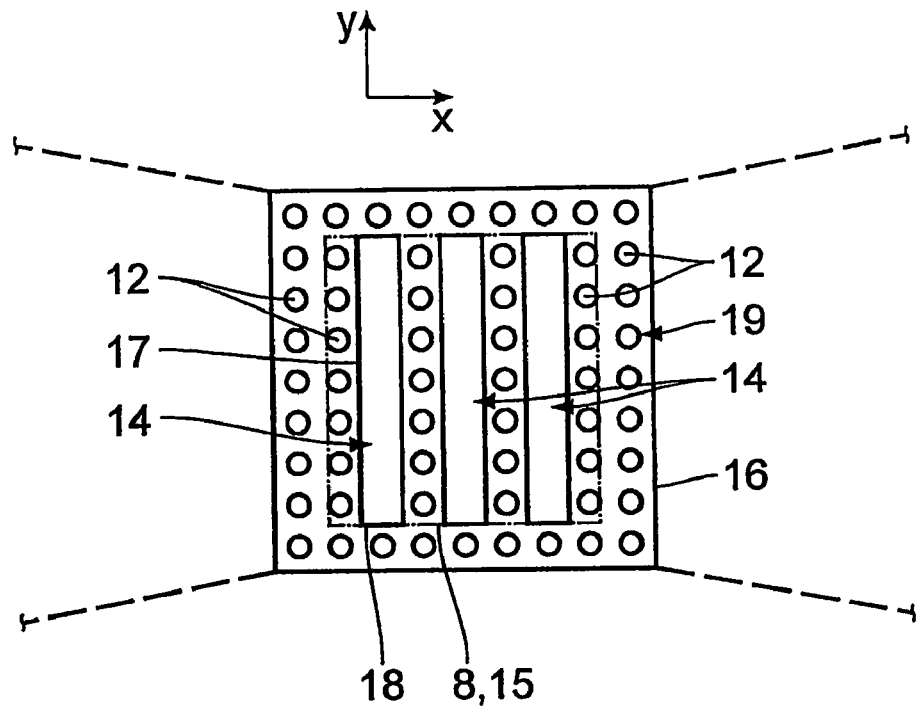
Figure 12:
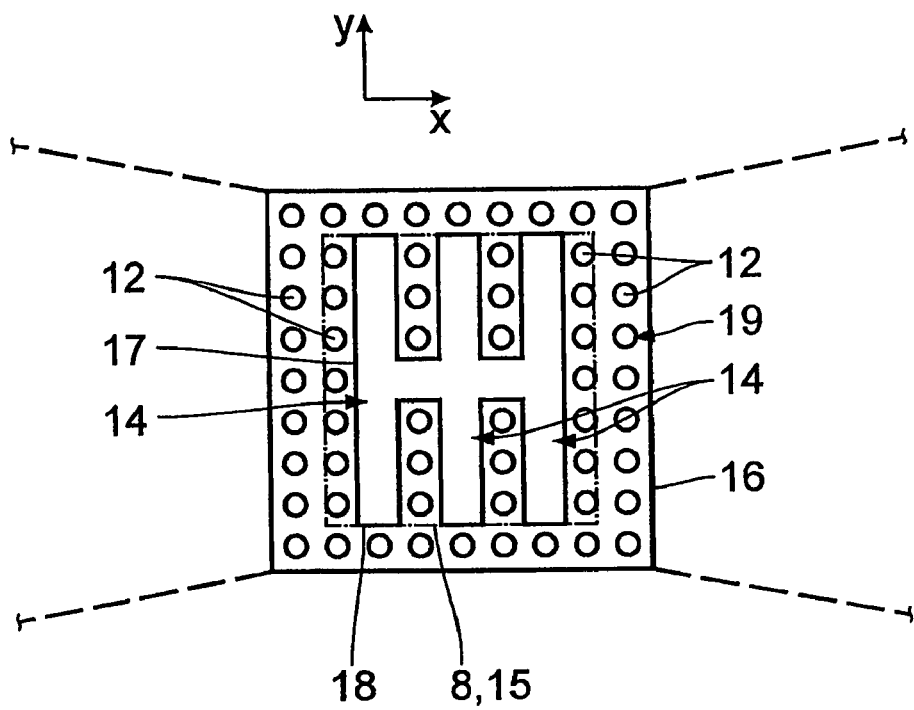

The embodiment according to FIG. 11 resembles that according to FIG. 10, so that the embodiment according to FIG. 11 is described only, where it differs from that according to FIG. 10. In the embodiment according to FIG. 11 the free sectors 14 along their long sides 17 are extended in such a manner that with an equal grid dimension now seven heat transfer holes 12 are adjacent to the long sides 17. Consequently, in contrast to the embodiment according to FIG. 10 six heat transfer holes are omitted at the expense of an appropriate enlargement of the free sectors 14. Thus, in the embodiment according to FIG. 11 there are 60 heat transfer holes 12. The surface of the free sectors 14 enlarged in comparison to the embodiment according to FIG. 10 improves adhesion of the electronic component 3 at the printed circuit board 1.

The embodiment according to Fig. resembles 12 that according to FIG. 11, so that the embodiment according to FIG. 1 is described in the following only, where it differs from that according to FIG. 11. Between two adjacent free sectors 14 in the embodiment according to FIG. 12 the middle each of the seven heat transfer holes 12 along the long sides 17 of the free sectors 14 is omitted. At the place of this omission an additional free surface section in form of a line results in the case of the representation according to FIG. 12. Also at this place the solder layer 8 is freely accessible, so that compared to the embodiment according to FIG. 11 adhesion of the electronic component 3 at the printed circuit board 1 is improved again. The embodiment according to FIG. 12 has a total of 58 heat transfer holes, as in comparison to FIG. 11 two heat transfer holes 12 are omitted.

Figure 13:
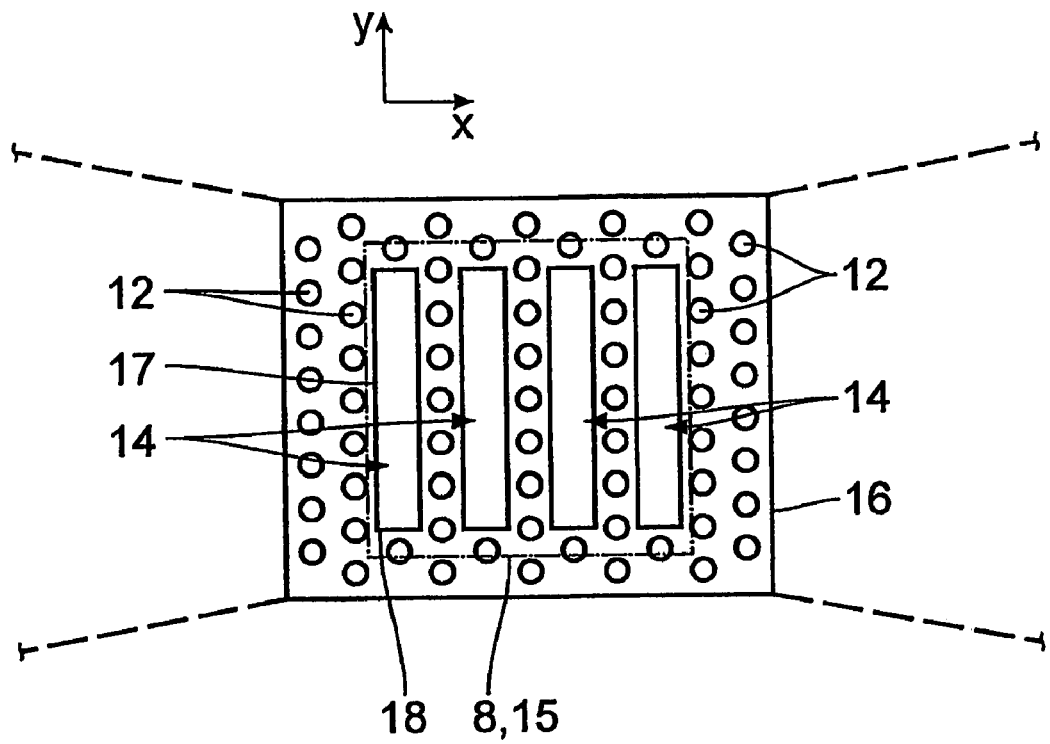

On the basis of a comparison with the embodiment according to FIG. 4 the embodiment according to FIG. 13 is described, where it differs from the embodiment to FIG. 4. The four free sectors 14 comprise lengthwise seven heat transfer holes 12, the outer two holes of these seven heat transfer holes 12 being located so far outside that they protrude slightly beyond the long sides 17. One heat transfer hole 12 each is adjacent to the narrow sides 18, so that each of the four free sectors 14 is surrounded all around by a total of sixteen heat transfer holes 12. Further heat transfer holes 12 are arranged around the three free sectors 14 according to the type of a simple cubic packing with a grid width of 1.25 mm within the surface region 16. Apart from the heat transfer holes 12 lacking in the region of the free sectors 14 there is a total of eleven columns of heat transfer holes 12, with columns with eight heat transfer holes 12, which are present also at the edge side, alternating with columns of nine heat transfer holes 12 being offset hereunto. The surface region 16 of the printed circuit board 1, which is provided with heat transfer holes 12, has dimensions of 12.5 mm in x-direction and of 11.5 mm in y-direction. All in all there are 69 heat transfer holes 12 with the variant according to FIG. 13. Due to the simple cubic packing there is a relatively high number of heat transfer holes 12 around the three free sectors 14. Therefore, in this region this amounts to a good heat transfer.

Figure 14:
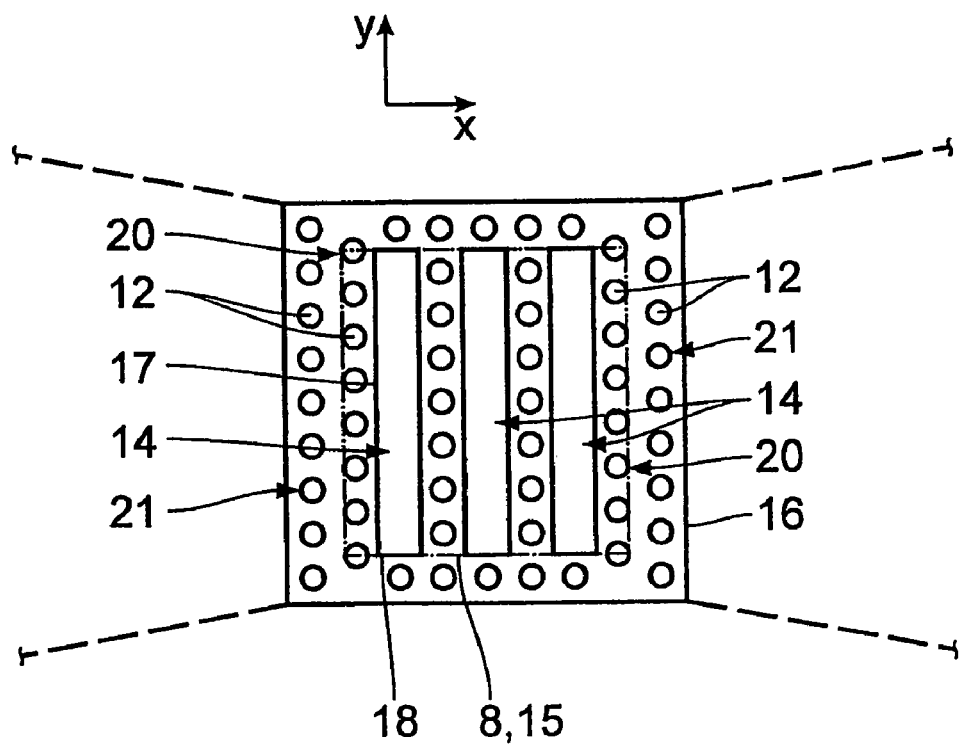

The embodiment according to FIG. 14 is described in the following only, where it differs from that according to FIG. 11. In the embodiment according to FIG. 14 the heat transfer holes 12 adjacent to the long sides 17 and the narrow sides 18, what concerns the long sides 17 and the narrow sides 18 facing each other, are arranged in the same way as the heat transfer holes 12 in the embodiment according to FIG. 11. At the two outer long sides 17 of the outside free sectors 14 two simply cubically packed columns 20, 21 of heat transfer holes 12 are attached. The two interior columns 20, directly adjacent to the long sides 17, have eight heat transfer holes 12 each. The two outer columns 21 have nine heat transfer holes 12 each. The grid dimension is 1.25 mm. Therefore, in the embodiment according to FIG. 14 there is a total of 58 heat transfer holes 12. In the region of the long sides 17 of the two outer free sectors 14 there is a good heat passage due to the simple cubic packing of the heat transfer holes 12 available there. Compared to the cubic-face-centered packing with a given surface and grid dimension the simple cubic packing allows for a higher number of heat transfer holes 12, which can be accommodated.

Figure 15:
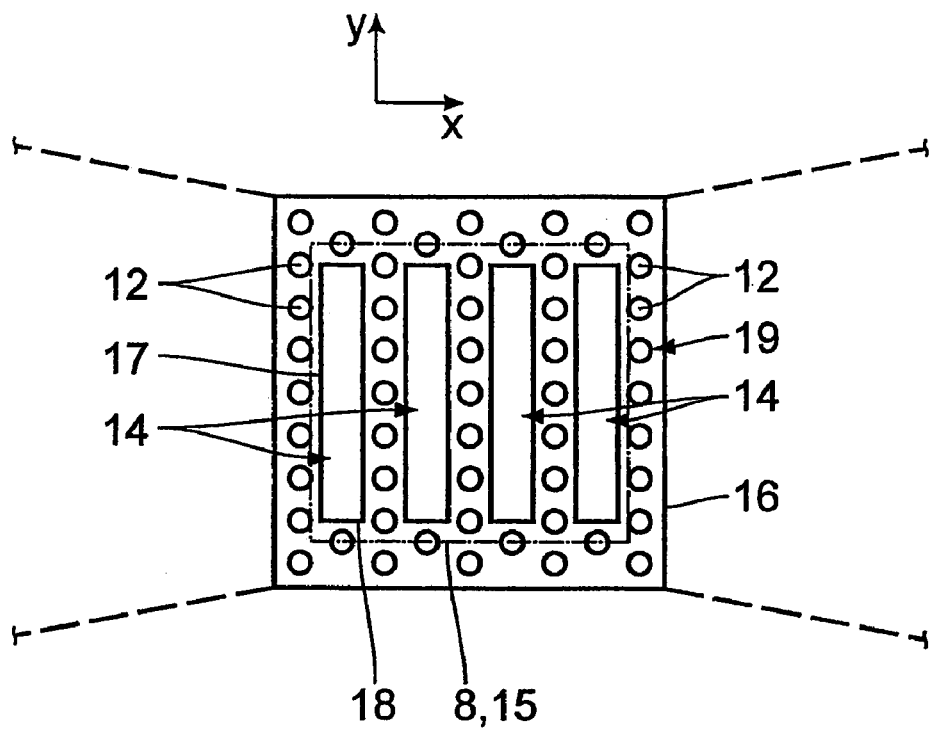

The embodiment according to FIG. 15 is described only, where it differs from that according to FIG. 13. In the embodiment according to FIG. 15 the outer left and the outer right column of heat transfer holes are omitted. There is a total of 53 heat transfer holes 12 in a simple cubic packing. The surface region 16 provided with heat transfer holes 12 is reduced to 10.5 mm in x-direction and to 11.5 mm in y-direction.

Figure 16:
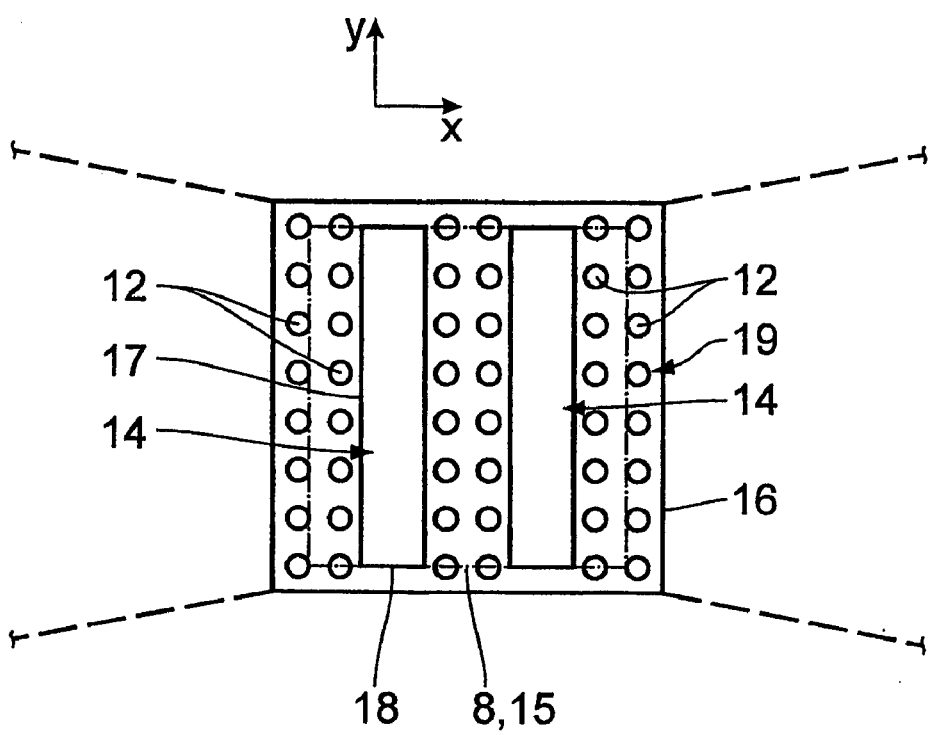

The embodiment according to FIG. 16 has two free sectors 14, which in FIG. 16 are arranged in columns, i.e. along the y-direction. The solder layer 8 is accessible only in the region of the free sectors 14 on the top face 2 of the printed circuit board 1. Eight heat transfer holes 12 each are assigned adjacent to the long sides 17 of the free sectors 14. Between the two free sectors 14 as well as on the respective opposite side of the free sectors 14 there are two columns each of heat transfer holes 12 in cubic-face-centered manner with a grid dimension of 1.25 mm. All in all the embodiment according to FIG. 16 thus comprises six columns of each eight heat transfer holes 12, thus a total of 48 heat transfer holes 12. The surface region 16, which is provided with heat transfer holes 12, has dimensions of 10.25 mm×10.25 mm.

Figure 17:
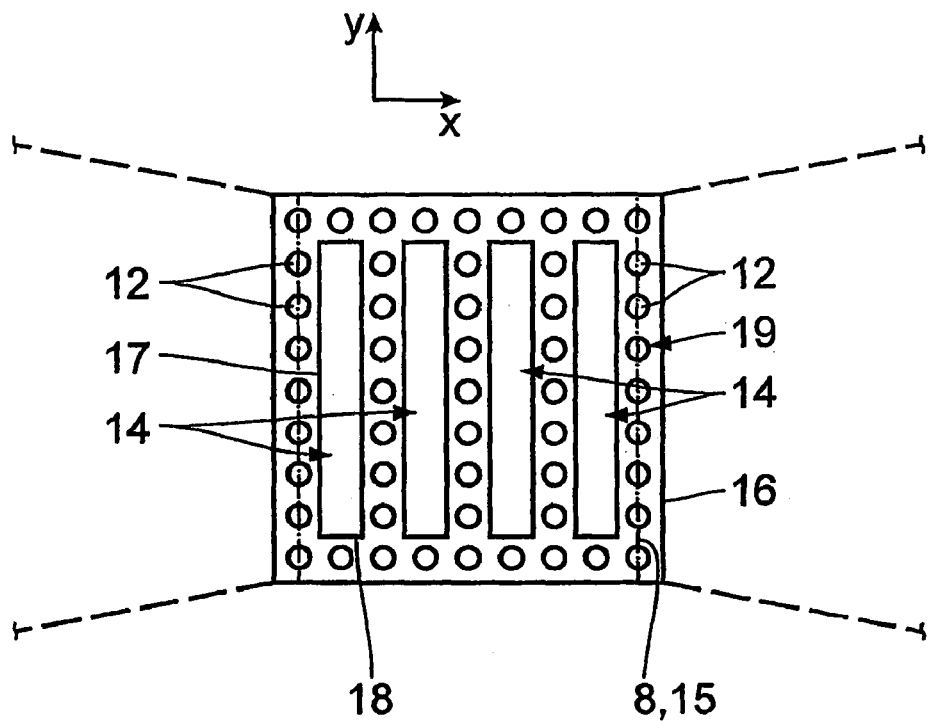

The embodiment according to FIG. 17 is described in the following only, where it differs from that according to FIG. 4. In the embodiment according to FIG. 17 not eight, but seven heat transfer holes 12 are adjacent to the long sides of the free sectors 14. Therefore, all in all the embodiment according to FIG. 17 has five heat transfer holes 12 less than the embodiment according to FIG. 4, so that there is a total of 53 heat transfer holes 12. The decrease of the number of heat transfer holes 12 along the long sides 17 is accompanied by an appropriate shortening of the long sides 17, so that the surface region 16, which is provided with heat transfer holes 12, has dimensions of 9 mm×9 mm.

Figure 18:
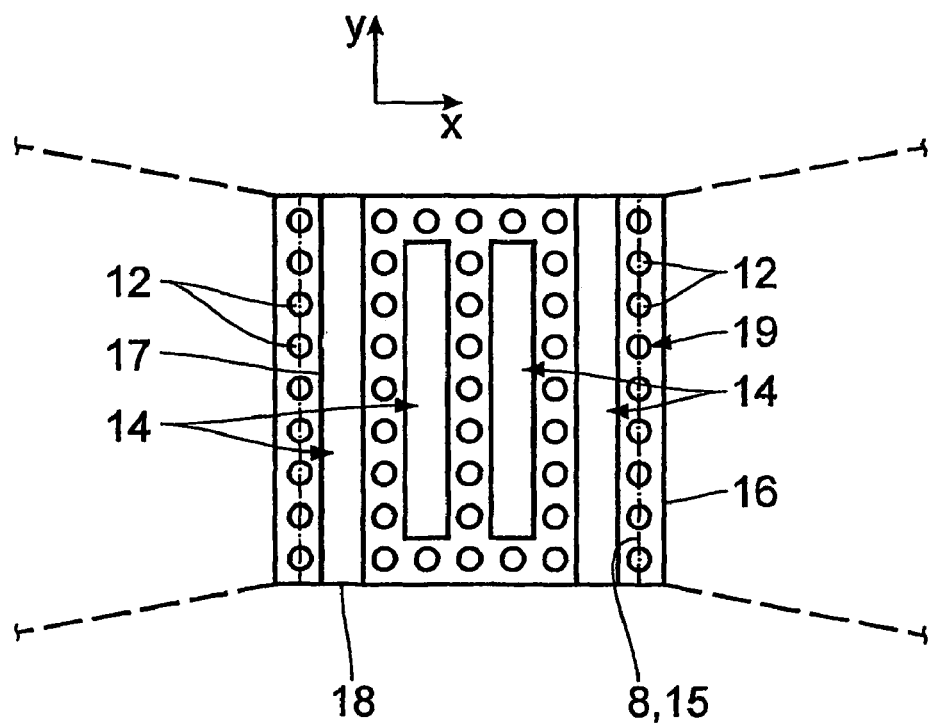

The embodiment according to FIG. 18 is described only, where it differs from that according to FIG. 17. In the embodiment according to FIG. 18 the two outer free sectors 14 are extended along their long sides 17 up to the edge of the surface region 16 in such a manner that the heat transfer holes 12 adjacent to the small sides 18 are not available there in contrast to the embodiment according to FIG. 17. Thus, all in all the embodiment according to FIG. 18 has four heat transfer holes 12 less than the embodiment according to FIG. 17, so that this results in a total of 49 heat transfer holes 12. Due to the outer two free sectors 14 enlarged through this adhesion of the electronic component 3 at the printed circuit board 1 is improved.

Figure 19:
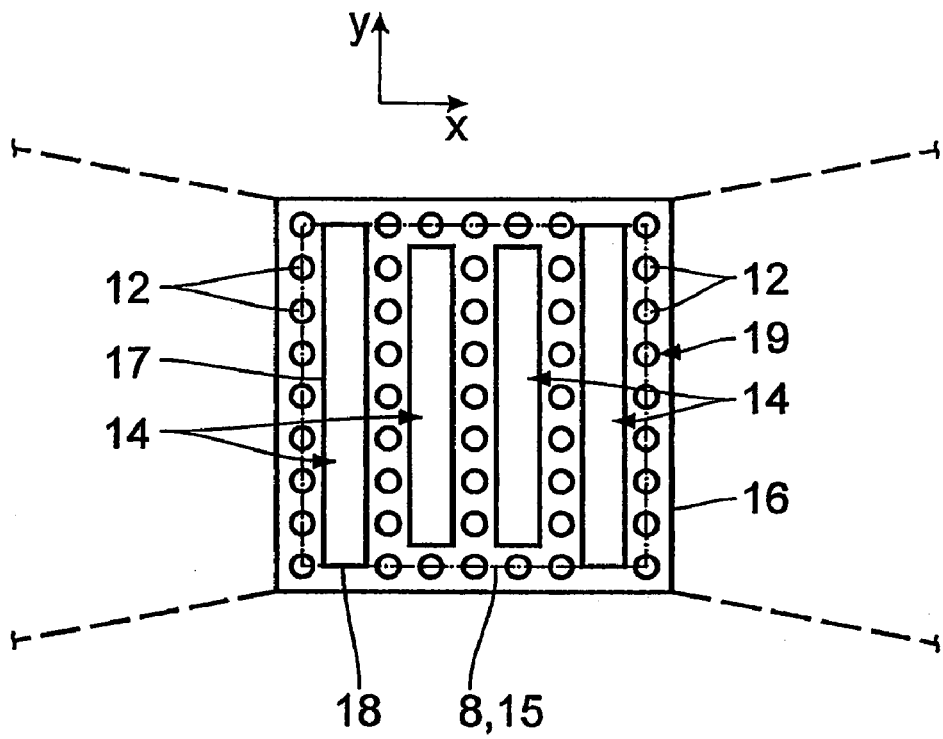

The embodiment according to FIG. 19 is described in the following only, where it differs from that according to FIG. 4. Similar as in the embodiment according to FIG. 18 also in the embodiment according to FIG. 19 the heat transfer holes 12 adjacent the small sides of the two outer free sectors 14 are omitted and these two outer free sectors 14 are drawn up to the edge of the connecting region 15. In comparison to the embodiment according to FIG. 4 thus in the embodiment according to FIG. 19 four heat transfer holes are lacking, so that there is a total of 54 heat transfer holes 12.

Figure 20:
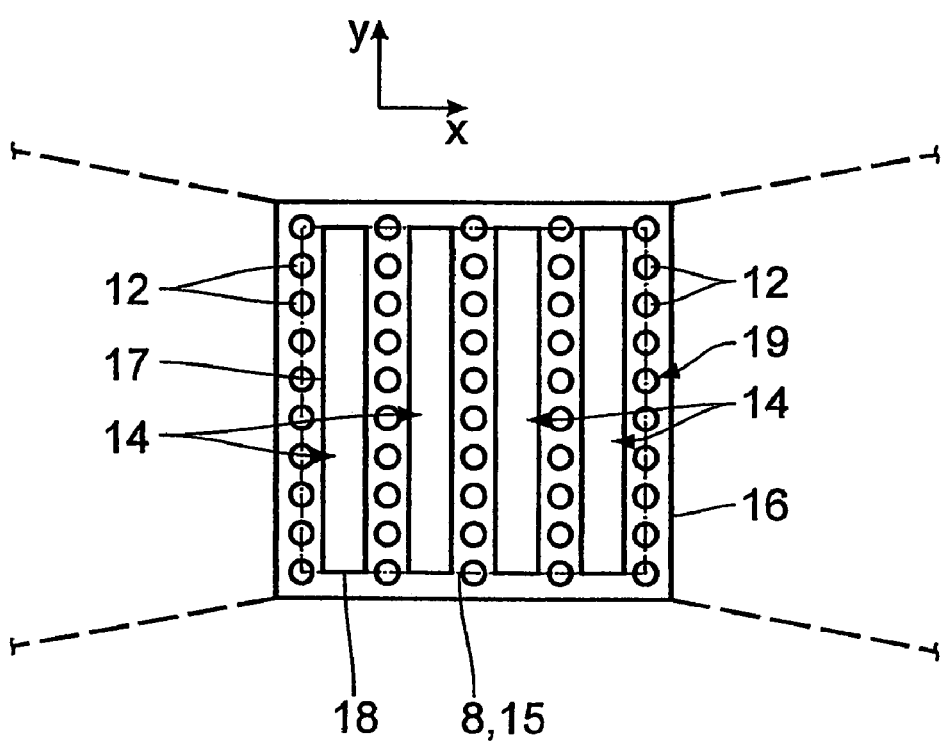

The embodiment according to FIG. 20 is described only, where it differs from that according to FIG. 19. In the embodiment according to FIG. 20 also the heat transfer holes 12 adjacent to the small sides of the two interior free sectors 14 are omitted and these two interior free sectors 14 are drawn up to the edge of the connecting region 15. Thus, there are five columns of heat transfer holes 12 of each ten heat transfer holes 12, a free surface section 14 each being between two adjacent of these columns.

Figure 21:
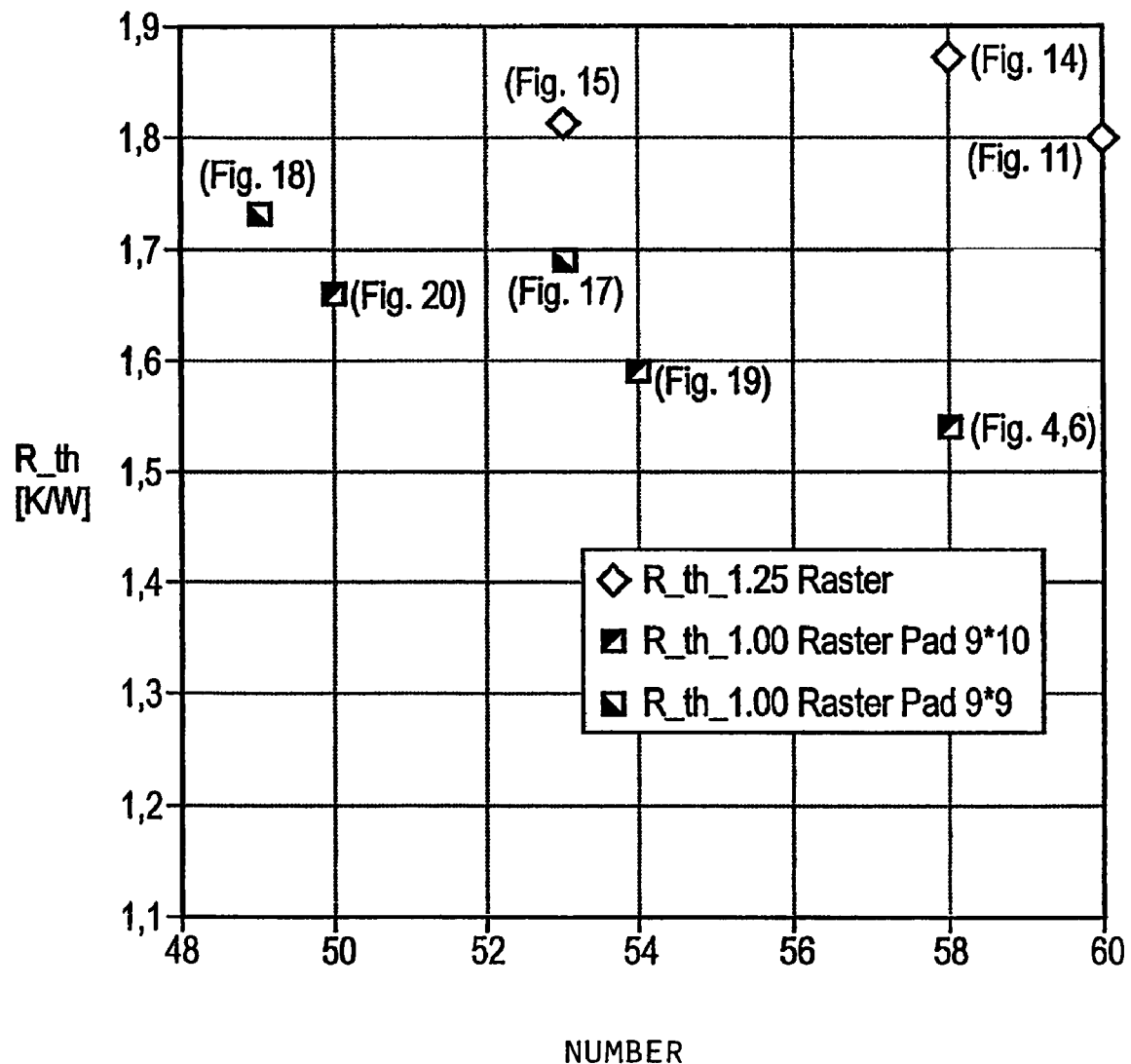
FIG. 21 a diagram, which as a function of the number of heat transfer holes shows the thermal resistance of different forms of embodiment of the printed circuit boards.

The diagram according to FIG. 21 makes clear the influence of different parameters onto the heat transfer through the printed circuit board 1. The thermal resistance $R_{th}$ is applied dependent on the number of heat transfer holes 12. The squares indicate the thermal resistance for arrangements with the grid width 1.0 mm.

The square at the number of 49 corresponds to the arrangement according to FIG. 18. Here, there is a thermal resistance of approximately 1.73 K/W. This value results from a model calculation, in which apart from geometry of the arrangement also heat conductivities, heat capacities and the densities of the different materials involved are taken into account.

The square at the number of 50 corresponds to the arrangement according to FIG. 20. There, in comparison to the arrangement according to FIG. 18, the thermal resistance is reduced to approximately 1.66 K/W. Apart from the enlargement of the number of heat transfer holes 12 this is also caused by the fact that the surface region 16 in the embodiment according to FIG. 20 is enlarged in relation to the embodiment according to FIG. 18. Thus, a larger heat transfer surface is created, what reduces the thermal resistance.

The square at the number of 53 corresponds to the arrangement according to FIG. 17. In this arrangement there is a thermal resistance of approximately 1.69 K/W. In comparison to the arrangement according to FIG. 20 here, two effects compete against each other: On the one hand in the arrangement according to FIG. 17 the surface region 16 is smaller than in the arrangement according to FIG. 20, what increases the thermal resistance. On the other hand the arrangement according to FIG. 17 has three heat transfer holes 12 more, what reduces the thermal resistance.

The square at the number of 54 stands for the arrangement according to FIG. 19. Here, there is a thermal resistance of approximately 1.59 K/W. In comparison to the arrangement according to FIG. 20 there are four additional heat transfer holes 12 in this case, so that this results in an accordingly low thermal resistance.

The square at the number of 58 corresponds to the arrangement according to FIG. 4 or 6, respectively. Here, in comparison to the arrangement according to FIG. 19 there are four further heat transfer holes 12, so that the thermal resistance continues to be reduced to approximately 1.54 K/W.

The lozenge at the number of 53 corresponds to the arrangement according to FIG. 15. Here, there is a larger grid dimension of the heat-transfer holes-12, so that this results in a larger thermal resistance of approximately 1.81 K/W compared to the arrangement according to FIG. 17 with the same number of heat transfer holes 12.

The lozenge for the number of 58 corresponds to the arrangement according to FIG. 14. Here, there are two columns of heat transfer holes 12, i.e. the two columns 21, which are relatively far away from the connecting region 15, in which the electronic component 3 rests upon the printed circuit board 1. This explains the relatively high thermal resistance of approximately 1.87 K/W in the embodiment according to FIG. 14.

The lozenge for the number of 60 corresponds to the arrangement according to FIG. 11. Due to the high number of heat transfer holes 12 this results in a reduction of the thermal resistance to approximately 1.8 K/W.

While considering the parameters
total area of the accessible solder layer 8, which should be as large as possible for optimizing the adhesion of the electronic component 3 at the printed circuit board 1,
size of the surface region 16, which for realizing a compact as possible printed circuit board 1 should not be too large,
number of heat transfer holes 12, which for realizing a good heat transfer should be large, but for reasons of manufacturing costs and possibilities should be not too large, the embodiment according to FIG. 4 turns out to be particularly suitable according to the current state.

The invention claimed is:

1. A printed circuit board (1)
with a top face (2) for positioning an electronic component (3),
with a bottom face (4) to support on a heat-dissipating base (5),
with a plurality of heat transfer holes (12), which create a heat transfer from the top face (2) to the bottom face (4),
wherein the heat transfer holes (12) are non-uniformly distributed on the top face (2) in such way that the top face (2) has several free sectors (14), which are free from heat transfer holes (12) in order to connect the electronic component (3) to the printed circuit board (1),
characterized in that the free sectors (14) are each configured as a respective elongated free area having an elongated strip shape with two opposite longer sides extending parallel to an elongation direction and two opposite shorter sides extending transversely to the elongation direction, wherein the longer sides are longer than the shorter sides, and wherein a respective plurality of the heat transfer holes are positioned adjacent to each one of the longer sides and are spaced apart from one another in a respective row extending parallel to the elongation direction along each one of the longer sides of the elongated free areas, and wherein an in-row spacing distance between adjacent ones of the heat transfer holes in one of the rows is less than a transverse spacing distance between two of the rows that are respectively adjacent to the two opposite longer sides of one of the elongated free areas.

2. A printed circuit board according to claim 1, characterized in that at least three free sectors (14) are provided.

3. A printed circuit board according to claim 1, characterized in that four free sectors (14) are provided.

4. A printed circuit board according to claim 1, characterized in that at least two of the free sectors (14) are surrounded all around by heat transfer holes (12).

5. A printed circuit board according to claim 1, characterized in that all of the free sectors (14) are respectively surrounded all around by heat transfer holes (12).

6. A printed circuit board according to claim 1, characterized in that approximately fifty heat transfer holes (12) are provided in a section (16) of the printed circuit board (1) with surface dimensions of approximately 10 mm×10 mm.

7. A printed circuit board according to claim 1, characterized in that the heat transfer holes (12) are provided exclusively at a place (15) on the top face (2) of the printed circuit board (1), where the heat transfer holes are at least partially covered by an electronic component (3) when the electronic component is supported on the top face.

8. A printed circuit board according to claim 1, characterized in that a surface region (16) of the top face (2) of the printed circuit board (1), which is provided with the heat transfer holes (12), is geometrically adapted to a geometry of a contact surface of the electronic component (3) contacting the top face (2) of the printed circuit board (1).

9. A printed circuit board according to claim 1, characterized in that apart from the free sectors (14), the heat transfer holes (12) are arranged in a regular grid with a grid width of at most 1.5 mm.

10. A printed circuit board according to claim 9, wherein said grid width is at most 1.25 mm.

11. A printed circuit board according to claim 9, wherein said grid width is at most 1.0 mm.

12. A printed circuit board according to claim 9, characterized in that the grid of the heat transfer holes (12) comprises a simple cubic packing.

13. A printed circuit board according to claim 1, characterized by a solder layer (8) being applied on the top face (2) in areas for connecting the electronic component (3) to the printed circuit board (1), wherein the solder layer (8) is freely accessible only within the free sectors (14) on the top face (2).

14. A printed circuit board according to claim 13, wherein the solder layer (8) is applied only within the free sectors (14) on the printed circuit board (1).

15. A printed circuit board according to claim 14, characterized in that the solder layer (8) within the free sectors (14) is rectangular with dimensions of approximately 1 mm×10 mm.

16. A printed circuit board according to claim 1, characterized in that the heat transfer holes (12) comprise a width between 0.3 mm and 0.5 mm.

17. A printed circuit board according to claim 1, characterized in that each one of the heat transfer holes (12) carries on an interior side thereof a heat conducting metal coating.

18. A printed circuit board according to claim 17, wherein the heat conducting metal coating has a layer thickness in a range around 30 µm.

19. A printed circuit board according to claim 1, characterized in that the heat transfer holes (12) are unfilled and open.

20. A circuit board including a pad area for mounting an electronic device on said pad area, wherein said pad area of said circuit board has heat transfer holes passing therethrough and forming respective heat transfer paths therethrough from a top surface to a bottom surface thereof, wherein:

said holes are arranged as rows of said holes that extend parallel to one another along a longitudinal direction and that are distributed to form on said top surface plural holed strips each having one or more of said rows of said holes and plural hole-free strips free of said holes;

said hole-free strips are elongated in said longitudinal direction and are located between respective adjacent ones of said holed strips;

said holed strips each respectively include at least one of said rows that includes a plurality of said holes adjacent to and distributed in said longitudinal direction along a length of an adjacent one of said hole-free strips;

said holes in a respective one of said rows are spaced apart from one another at an in-row spacing distance along said longitudinal direction;

two of said rows of said holes that are respectively positioned adjacent to and along opposite sides of one of said hole-free strips are spaced apart from one another at a transverse spacing distance transversely to said longitudinal direction; and said transverse spacing distance is greater than said in-row spacing distance.

21. The circuit board according to claim 20, wherein each one of said holed strips respectively located between two of said hole-free strips respectively includes only exactly one of said rows of said holes.

22. The circuit board according to claim 20, wherein one of said holed strips located between two of said hole-free strips includes a plurality of said rows of said holes.

23. The circuit board according to claim 20, wherein one of said holed strips located between a periphery of said circuit board and an outermost one of said hole-free strips includes only exactly one of said rows of said holes.

24. The circuit board according to claim 20, wherein one of said holed strips located between a periphery of said circuit board and an outermost one of said hole-free strips includes a plurality of said rows of said holes.

25. The circuit board according to claim 20, wherein said holes in said rows are all uniformly spaced from one another at said in-row spacing distance.

26. The circuit board according to claim 20, wherein at least a selected one of said rows of holes includes a hole gap at which two successive holes in said selected row are spaced apart from one another at a spacing distance greater than said in-row spacing distance.

27. The circuit board according to claim 20, further including additional holes positioned at longitudinal ends, in said longitudinal direction, of said holed strips and of said hole-free strips.

28. The circuit board according to claim 20, wherein said holes are positioned according to a simple cubic packing pattern except for gaps in said pattern due to said hole-free strips.

29. The circuit board according to claim 20, wherein each one of said hole-free strips respectively has a configuration corresponding to one missing row of said holes, and has a transverse width on the order of a diameter of one of said holes.

* * * * *

UNITED STATES PATENT AND TRADEMARK OFFICE
CERTIFICATE OF CORRECTION

PATENT NO. : 7,804,030 B2
APPLICATION NO. : 11/918585
DATED : September 28, 2010
INVENTOR(S) : Friedrich et al.

It is certified that error appears in the above-identified patent and that said Letters Patent is hereby corrected as shown below:

Title page,
Item [73], Assignee,
Line 1, replace "Conti Temic microelectronics Gmbh" by
--Conti Temic microelectronic GmbH--;

Column 2,
Line 57, after "of", replace "1 mm×10 mm" by --1 mm × 10 mm--;

Column 5,
Lines 1 and 2, after "dimensions", replace "8 mm×9 mm" by --8 mm × 9 mm--;
Lines 43 and 44, after "dimensions", replace "10 mm×10 mm" by --10 mm × 10 mm--;

Column 6,
Line 7, after "of", replace "11.5 mm×11.5 mm" by --11.5 mm × 11.5 mm--;
Line 9, after "of", replace "8 mm×9 mm" by --8 mm × 9 mm--;

Column 7,
Line 61, after "of", replace "10.25 mm×10.25 mm" by --10.25 mm × 10.25 mm--;

Column 8.
Line 6, after "of", replace "9 mm×9 mm" by --9 mm × 9 mm--;

Column 9,
Line 16, after "heat-transfer, replace "holes-12" by --holes 12--;

Column 10,
Line 20, after "approximately", replace "10 mm×10 mm" by --10 mm × 10 mm--;
Line 55, after "approximately", replace "1 mm×10 mm" by --1 mm × 10 mm--.

Signed and Sealed this
Twenty-fourth Day of May, 2011

David J. Kappos
*Director of the United States Patent and Trademark Office*